(12) United States Patent
Cosentino et al.

(10) Patent No.: US 7,098,743 B2
(45) Date of Patent: Aug. 29, 2006

(54) CASCODE AMPLIFIER

(75) Inventors: Gaetano Cosentino, Catania (IT); Giovanni Cali', Catania (IT); Felice Torrisi, Carlentini (IT); Roberto Pelleriti, Catania (IT)

(73) Assignee: Stmicroelectronics S.R.L., Agrate Brianza (IT)

( * ) Notice: Subject to any disclaimer, the term of this patent is extended or adjusted under 35 U.S.C. 154(b) by 46 days.

(21) Appl. No.: 10/853,368

(22) Filed: May 24, 2004

(65) Prior Publication Data

US 2004/0239430 A1 Dec. 2, 2004

(30) Foreign Application Priority Data

May 27, 2003 (IT) ............... MI2003A1055

(51) Int. Cl.
*H03F 1/22* (2006.01)
(52) U.S. Cl. .................................. 330/311
(58) Field of Classification Search ........ 330/310–311, 330/296, 98, 99–100, 253
See application file for complete search history.

(56) References Cited

U.S. PATENT DOCUMENTS

| 4,079,336 A | * | 3/1978 | Gross ................ 330/296 |
| 5,180,989 A | * | 1/1993 | Sakurai et al. ........ 330/295 |
| 6,122,532 A | * | 9/2000 | Taylor ............... 455/574 |
| 6,133,793 A | | 10/2000 | Lau et al. |

OTHER PUBLICATIONS

"Tube Cad: Tube Circuits"; Glassware Audio Design Software; www.glass-ware.com/tubecad/TC_Tube_Circuit_Descriptions. html; May 25, 2004; 6 pages.

Laug "A Precision Power Amplifier for Power/Energy Calibration Applications"; IEEE Transactions on Instrumentation & Measurement; Dec. 1987; pp. 994-1000; vol. IM-36, No. 4; New York, NY, US.

Ramírez-Angulo, et al. "Low-Voltage Continuous Time Filters Based on OTAS and Miller Integrators"; IEEE International Symposium on Circuits and Systems (ISCAS), Circuits and Systems Connecting the World (May 12-15, 1996, Atlanta); May 12, 1996; pp. 493-496; vol. 2; New York, US.

European Search Report, Aug. 8, 2005.

* cited by examiner

*Primary Examiner*—Robert Pascal
*Assistant Examiner*—Hieu Nguyen
(74) *Attorney, Agent, or Firm*—Hogan & Hartson L.L.P.

(57) ABSTRACT

The present invention refers to a cascode amplifier suitable for amplifying a voltage signal present on the input terminal. The amplifier comprises at least one first transistor comprising a non-drivable input terminal that coincides with the input terminal of the amplifier, a non-drivable output terminal and a drivable terminal connected to a first polarization voltage. The amplifier comprises in addition at least one second transistor comprising a non-drivable input terminal in common with the output terminal of the first transistor, an output terminal non-drivable connected to a second polarization voltage and a drivable terminal. The amplifier also comprises a feedback element placed between the output terminal of the second transistor and the drivable terminal of the first transistor and circuit means coupled between the drivable terminals of the first and of the second transistor and suitable for making the values of voltage on the drivable terminal and on the output terminal of the first transistor substantially the same.

11 Claims, 5 Drawing Sheets

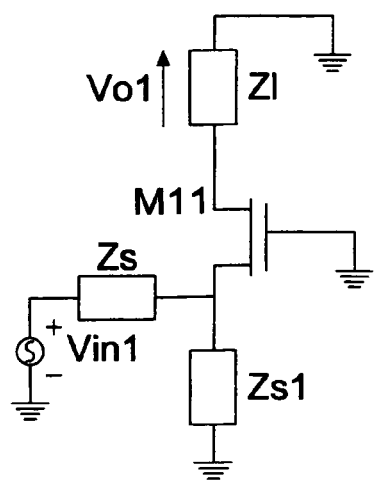
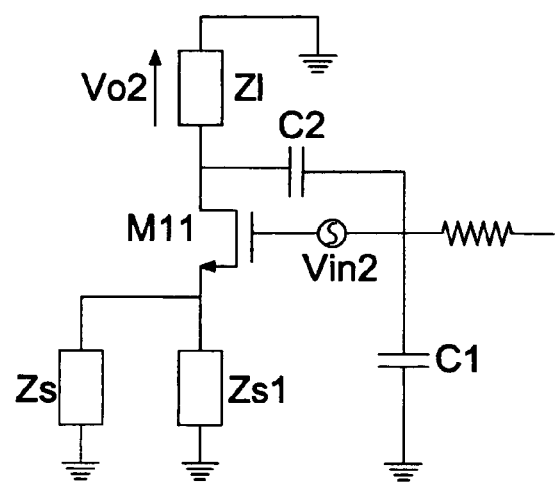
Fig.4b            Fig.4c
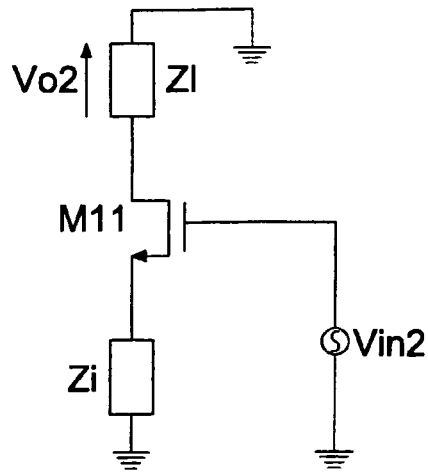
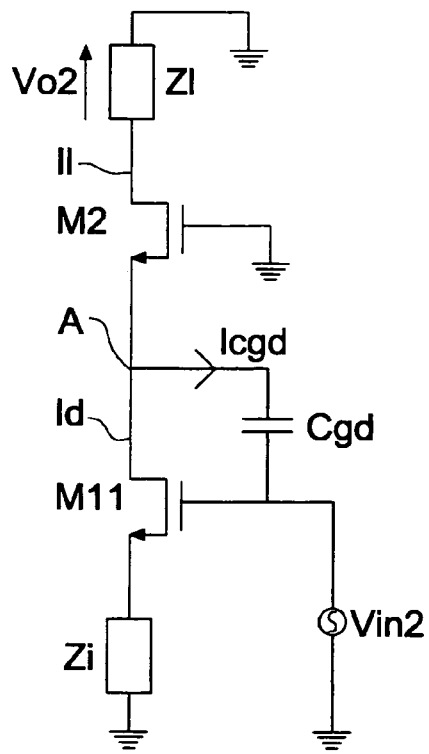
Fig.4d            Fig.4e

CASCODE AMPLIFIER

BACKGROUND OF THE INVENTION

1. Field of the Invention

The present invention describes a cascode amplifier.

2. State of the Art

Amplifiers of the cascode type are often used to obtain high gain and high output impedance and present good characteristics of linearity of the output signal. A typical configuration of a cascode circuit stage, shown in FIG. 1, is constituted by a common source MOS transistor M1 and by a common gate MOS transistor having the source terminal in common with the drain terminal of the transistor M1. The input terminal IN is the gate terminal of the transistor M1 while the output terminal OUT is the drain terminal of the transistor M2. The polarisation voltages V1–V3 are connected respectively with the drain terminal of the transistor M2, with the gate terminal of the transistor M2 and with the gate terminal of the transistor M1. Normally a minimisation of the Miller effect on the capacitance present between the drain and the gate terminals of the transistor M1 is obtained with this type of amplifier considering that the voltage on the drain terminal of the transistor M1 is set by the voltage on the source terminal of the transistor M2. Nevertheless, above all in the case of wide variations of voltage on the input terminal and in the case in which the equivalent resistance on the source terminal of the transistor M2 is high, there is an increase of the Miller effect; this causes high distortion of the output signal from the amplifier.

The increase of the Miller effect is still more remarkable in the case in which the cascode amplifier has to have a wide field of variation of the voltage. In that case in fact the cascode amplifier presents a circuit structure with feedback by means of a passive element.

A circuit type of a cascode amplifier with feedback used is shown in FIG. 2 where a MOS transistor M11 with common gate is positioned in the place of the MOS transistor M1 having as input terminal the source terminal; a resistance Rf is placed between the gate terminal of the transistor M11 and the output terminal OUT of the cascode amplifier.

SUMMARY OF THE INVENTION

In view of the state of the art, the object of the present invention is to provide a cascode amplifier that has better characteristics of linearity than those of known cascode amplifiers.

In accordance with the present invention this object is achieved by means of a cascode amplifier suitable for amplifying a voltage signal present on the input terminal, said amplifier comprising at least one first transistor comprising a non-drivable input terminal that coincides with the input terminal of the amplifier, a non-drivable output terminal and a drivable terminal connected to a first polarisation voltage, at least one second transistor comprising a non-drivable input terminal in common with the output terminal of the first transistor, a non-drivable output terminal connected to a second polarisation voltage and a drivable terminal, a feedback element placed between the output terminal of the second transistor and the drivable terminal of the first transistor, characterised in that the amplifier comprises circuit means coupled between the drivable terminals of the first and of the second transistor and suitable for making the voltage values on the drivable terminal and on the output terminal of the first transistor substantially the same.

BRIEF DESCRIPTION OF THE DRAWINGS

The characteristics and advantages of the present invention will appear evident from the following detailed description of embodiments thereof, illustrated as non-limiting example in the enclosed drawings, in which:

FIGS. 4b–4f show equivalent circuits for the calculation of the open-loop gain of the circuit of FIG. 4;

DETAILED DESCRIPTION

Figure 1:
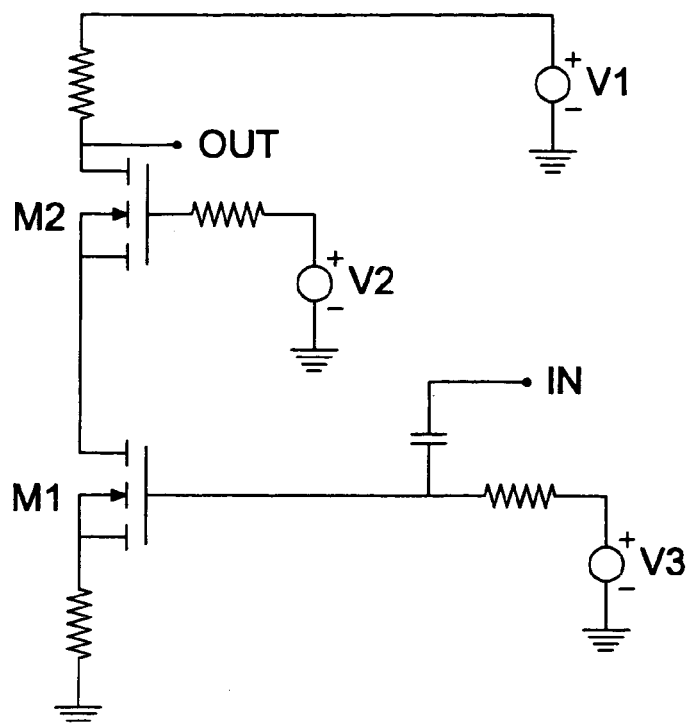
FIG. 1 is a circuit diagram of a known cascode amplifier.
Figure 2:
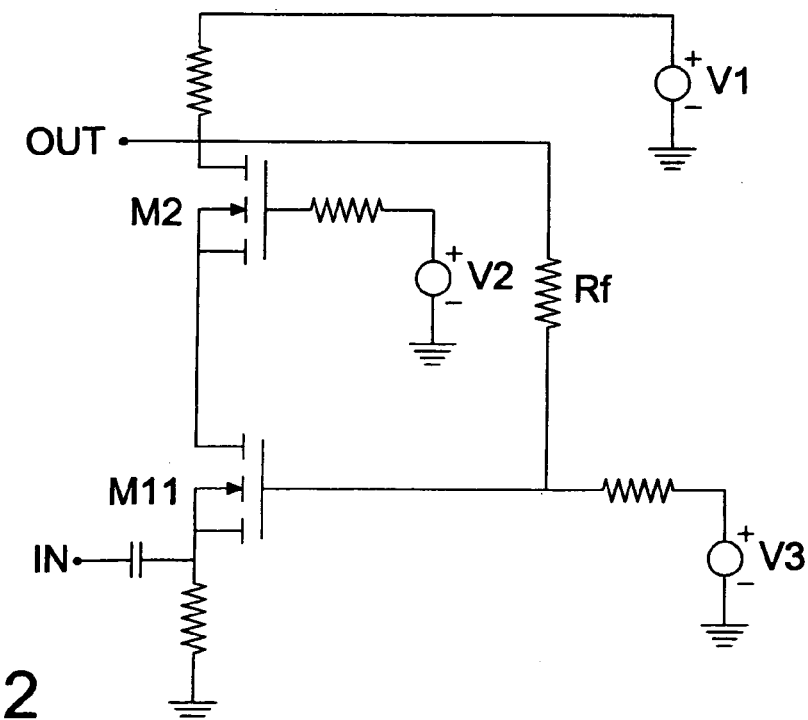
FIG. 2 is a circuit diagram of a known cascode amplifier with feedback.
Figure 3:
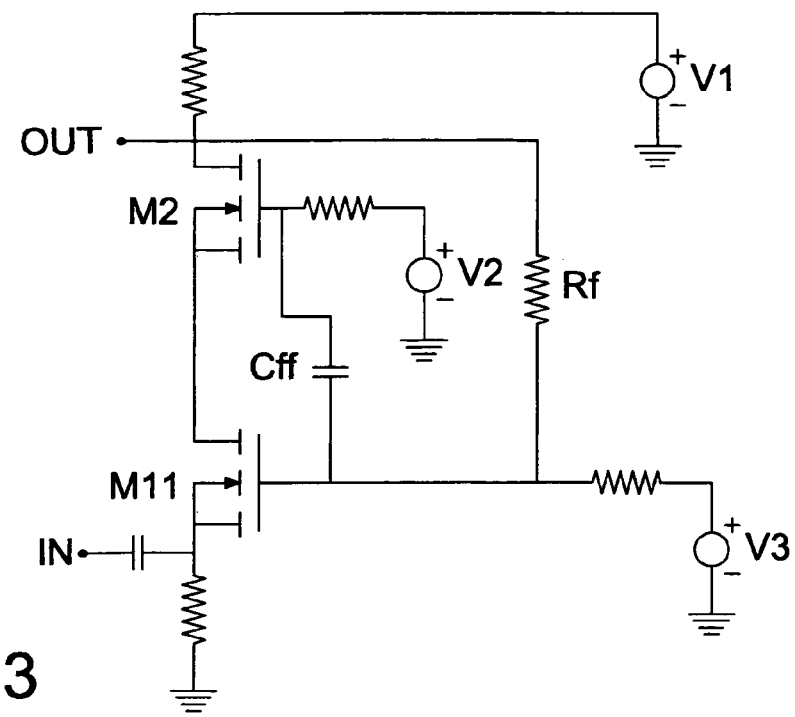
FIG. 3 is a circuit diagram of the cascode amplifier according to a first embodiment of the present invention.

With reference to FIG. 3 a circuit diagram of a cascode amplifier according to a first embodiment of the invention is shown; the elements that are the same as those present in the circuit diagram of FIG. 2 will be indicated with the same numeric references.

The cascode amplifier of FIG. 3 comprises at least a first transistor M11, preferably a MOS transistor, having a non-drivable input terminal IN (the source terminal), a non-drivable output terminal (the drain terminal), and a drivable terminal (the gate terminal) connected to a polarisation voltage V3. The cascode amplifier comprises at least a second transistor M2, preferably a MOS transistor, having a non-drivable input terminal (the source terminal) in common with the output terminal of the first transistor M11, a non-drivable output terminal OUT (the drain terminal) connected to another polarisation voltage V1 and a drivable terminal (the gate terminal) connected to a polarisation voltage V2. The amplifier also comprises a feedback element, preferably a resistance Rf, placed between the output terminal OUT and the drivable terminal of the first transistor M11. The cascode amplifier comprises circuit means coupled between the drivable terminals of the first and of the second transistor and suitable for making the voltage values on the drivable terminal and on the output terminal of the first transistor substantially the same.

Said circuit means are represented in FIG. 3 by a single capacitance Cff, placed between the drivable terminals of the transistor M11 and of the transistor M2 and suitable for constrain the voltage on the drivable terminal of the transistor M2 to the voltage present on the drivable terminal of the transistor M1. In particular if the value of the capacitance Cff is such that the voltage at its ends is nearly the same as the voltage between the gate terminal and the source terminal of the transistor M2 the result is that the voltage on the source terminal of the transistor M2 is substantially the same as the voltage on the gate terminal of the transistor M11. In this manner the effect due to the intrinsic capacitance present between the drivable terminal and the output terminal of the transistor M11 is compensated, that is the capacitance between gate and drain. The capacitance Cff generally assumes a value in the order of ten-odd Pico farad.

Figure 4:
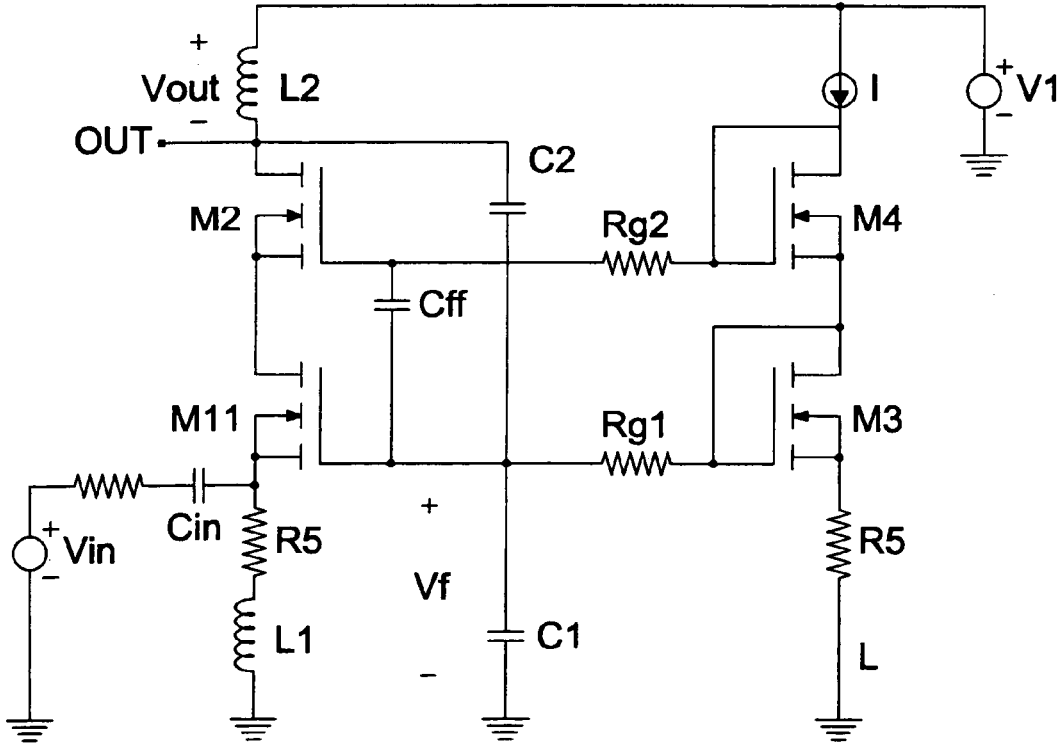
FIG. 4 is a circuit diagram of the cascode amplifier according to a variant to the first embodiment of the present invention.

In FIG. 4 is shown a circuit diagram of a cascode amplifier according to a variant to the first embodiment of the invention; the elements the same as those present in the circuit diagram of FIG. 3 will be indicated with the same numeric references. In relation to the cascode amplifier of FIG. 3, two inductances L1 and L2 are present; the first of which is connected between the source terminal of the transistor M11 by means of a resistance R5 and ground and the second is connected between the output terminal OUT and the voltage reference V1. A capacitance C2 is placed in feedback between the output terminal OUT and the gate terminal of the transistor M11. Another capacitance C1 is placed between the gate terminal of the transistor M11 and ground; a voltage Vf is present at the ends of said capacitance. The polarisation voltages V2 and V3 are not present but the polarisation of the MOS transistors M11 and M2 is obtained through the current generator I, the MOS transistors M3 and M4 connected to diode and the resistances Rg1, Rg2 and R5. A voltage signal Vin is connected to the source terminal of the transistor M11 by means of a capacitance Cin and the output voltage Vout is present on the inductance L2.

The gain in voltage Vout/Vin of the amplifier of FIG. 4 can be calculated not considering initially the transistor M2, which in the analysis for small signals only enables an increase of the output resistance of the amplifier. The open-loop gain is given by the product of two factors; a first factor is given by the open-loop gain of the amplifier of FIG. 4 without the transistor M2 and considered as equivalent to a common gate transistor and the second factor is given by the open-loop gain of the same amplifier considered as equivalent to a common source transistor.

In regard to the calculation of the first factor, considering the amplifier as a common gate transistor, the feedback mainly acts varying the input impedance. If we consider that the capacitive impedance due to the feedback capacitance C2 is greater than the impedance Zl due to the inductance L2 the result is that the current that flows in the transistor M11 will cross the majority of inductance L2. Making an analysis for small signals of the equivalent circuit shown in FIG. 4b where Zs is the capacitive impedance due to the input capacitance Cin and Zs1 is the impedance due to the series of the inductance L1 and of the resistance R5, the result is that the gain of voltage Av1 corresponding to the above-mentioned first factor is:

$$Av1 = \frac{Vo1}{Vin1} = \frac{Zl}{Zs + \frac{1}{g_m}}$$

where $g_m$ is the gain of transconductance of the MOS transistor M11. To obtain this gain the value of the impedance Zs1 has to be much greater than the value of the converse of the transconductance $g_m$. If $Zs=1/g_m$ that is in the case of matching of the input impedance the result is:

$$Av1 = \frac{Zl}{2*Zs}.$$

To determine the second factor of the open-loop gain, considering the amplifier like a common source transistor, that shown in FIG. 4c is considered like an equivalent circuit to make an analysis for small signals. The voltage signal Vin2 bound to the voltage signal Vo1 by the ratio $$Vin2 = \frac{Zc1}{Zc1 + Zc2}$$

Vo1 where Zc1 and Zc2 are the capacitive impedances of the capacitances C1 and C2. The circuit of FIG. 4c is simplified with the circuit of FIG. 4d and the gain of voltage Av2 corresponding to the above-mentioned second factor can be calculated:

$$Av2 = \frac{Vo2}{Vin2} = \frac{-\mu Zl}{r_d + Zl + (1+\mu)Zi}$$

where μ is given by the product of $g_m$ and $r_d$ where $r_d$ is the drain resistance of the transistor M11, and Zi is the impedance due to the parallel of the impedances Zs and Zs1. Presuming that μ is much greater than 1 the result is that the total gain of the open loop amplifier is:

$$Ao1 = \frac{Vout}{Vin} = Av1 * Av2 = \frac{g_m Zl}{2} * \frac{-\mu Zl}{r_d + Zl + \mu Zi} \frac{Zc1 + Zc2}{Zc1}$$

where

Vin=Vin1 and Vout=Vo2.

If the capacitance Cgd between gate and drain of the transistor M11 is not irrelevant the result is a current partition between the inductance L2 and the above-mentioned capacitance.

Figure 4F:
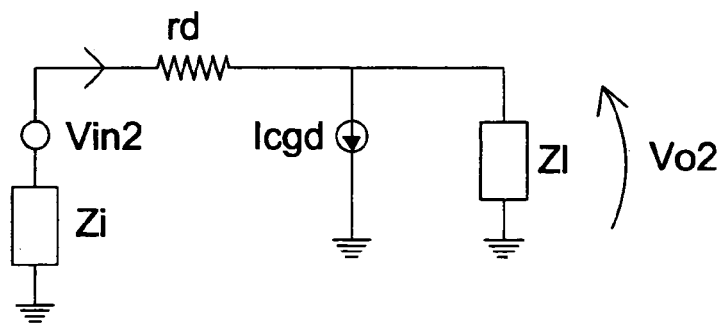

Wanting to calculate the contribution of said capacitance Cgd for the circuit of FIG. 4, it is sufficient to calculate its contribution for the calculation of the gain of the second factor Av2. The circuit equivalent is now that of FIG. 4e. Considering that with the contribution of the transistor M2 the terminal A, in common between the source terminal of the transistor M2 and the drain terminal of the transistor M11, is a point at low impedance the result is that the current Icgd that circulates on the capacitance between gate and drain of the transistor M11 is Icgd=−Vin/Zgd11 where Zgd11 is the capacitive impedance given by the capacitance Cgd between gate terminal and drain terminal of the transistor M11. Considering this contribution for the calculation of the gain Av2 by means of the circuit equivalent of FIG. 4f (in which the contribution of the transistor M2 is disregarded), considering that the total current Id that circulates on the drain terminal of the transistor M11 is given by Id=IL+Icgd where IL is the current that circulates in the inductance L, the result is:

$$Av2 = \frac{-\mu Zl + \frac{(Zl)^2}{Zgd11}}{r_d + Zl + (1+\mu)Zi} - \frac{Zl}{Zgd11}$$

Therefore there is a decrease of the gain Av2 and a consequent decrease of the total gain of the open loop amplifier AoI.

Considering the transistor M2 and the presence of the capacitance Cff a compensation of the capacitance between the gate and the drain terminal of the transistor M11 is obtained. In fact by means of the capacitance Cff the voltage on the gate terminal of the transistor M2 is bound to the voltage Vf which is the voltage between the gate terminal of the transistor M11 and ground. Therefore if the value of the capacitance Cff is such that the voltage at its ends is nearly the same as the voltage between the gate terminal and the source terminal of the transistor M2 the result is that the voltage Vsm2, that is the voltage on the source terminal of the transistor M2, is substantially the same as the voltage Vf. In this manner the Miller effect on the capacitance Cgd is negligible given that the current Icgd that crosses the impedance Cgd11 is substantially nil.

The capacitance Cff generally assumes a value in the order of ten-odd Pico faraday.

Figure 5:
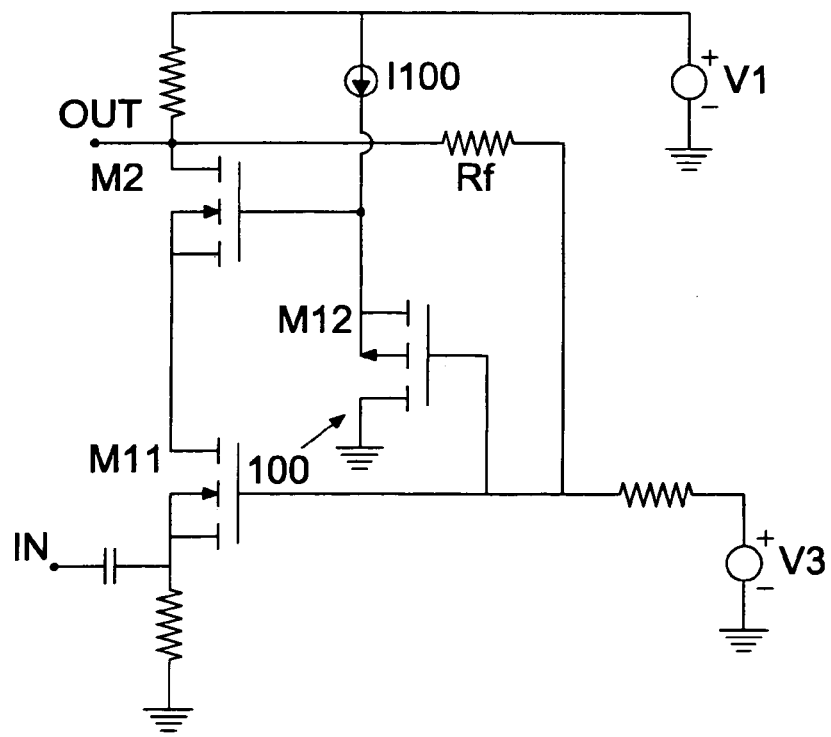
FIG. 5 is a circuit diagram of the cascode amplifier according to a second embodiment of the present invention.

In the second embodiment of the present invention, shown in the circuit of FIG. 5, the result is that, in a different manner from the circuit of FIG. 3, a buffer 100 is placed instead of the capacitance Cff, in this case a transistor PMOS M12. A current generator I100 is placed between the source terminal of the transistor M12 and the voltage V1. The voltage on the source terminal of the transistor M2 is made substantially the same as the voltage on the gate terminal of the transistor M11 given that the voltages between the gate and source terminals of the transistors M2 and M12 are substantially the same. In this manner the Miller effect on the capacitance Cgd is negligible.

Figure 6:
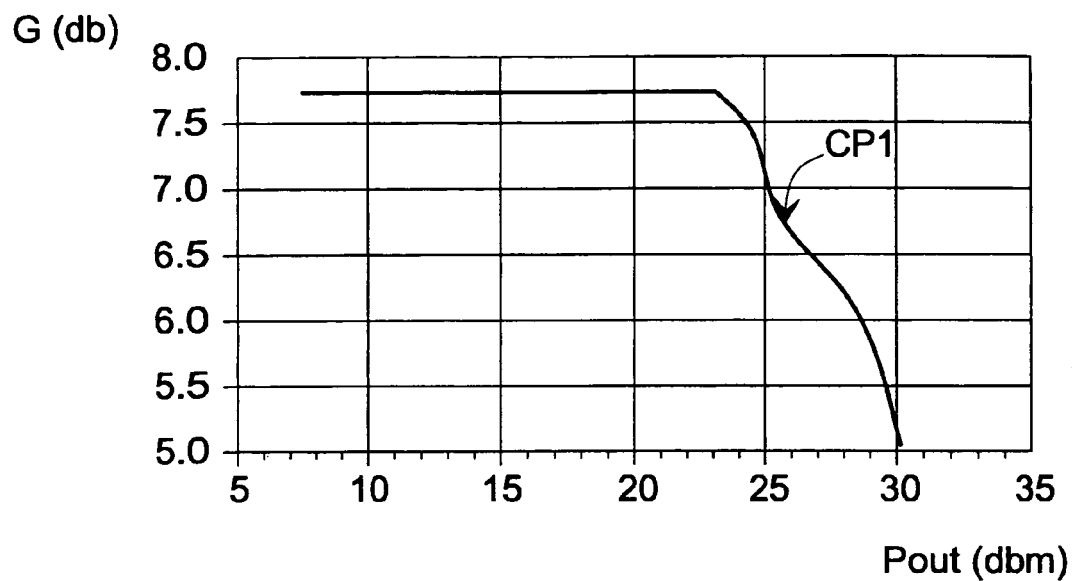
FIG. 6 is a diagram of the numeric gain available in function of the output power available of the circuit of FIG. 2.
Figure 7:
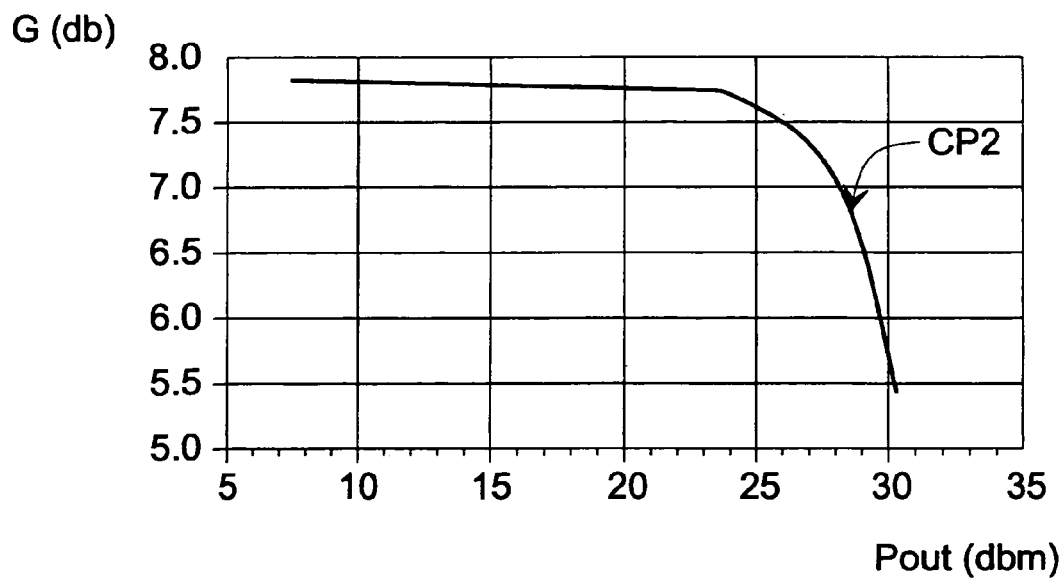
FIG. 7 is a diagram of the numeric gain available in function of the output power available of the circuit of FIG. 4.

The improvement that is obtained with the circuit of FIG. 4 according to the invention in comparison to the known circuit of FIG. 2 is visible with the diagrams of FIGS. 6 and 7 that show the varying of the numerical gain available G (expressed in decibels) in function of the output power available Pout (in decibels). The numerical gain available G is defined as the ratio between the output power available Pout and the input power available Pin: G=Pout/Pin. The diagram of FIG. 6 concerns the known circuit of FIG. 2 while the diagram of FIG. 7 concerns the circuit of FIG. 4. The points of compression of the gain G at 1 decibel CP1 and CP2 are visible in the diagrams, that is the points in which the output power available Pout of each circuit is less than 1 decibel compared to the output power available of an ideal two-port circuit; this is due to the distortion that the output signal from the circuit receives from the circuit itself. From the diagrams of FIGS. 6 and 7 it can be noted that the point of compression CP1 is lower than the point of compression CP2, that is the circuit of FIG. 4 presents a better linearity compared to the circuit of FIG. 2.

The cascode amplifier shown of the above-mentioned embodiments is an integrated device. While there have been described above the principles of the present invention it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

We claim:

1. A cascode amplifier suitable for amplifying a voltage signal present on an input terminal, said amplifier comprising:
   at least one first transistor including a first current node coupled to the input terminal, a second current node and a gate for receiving a first polarization voltage;
   at least one second transistor including a first current node coupled to the second current node of the first transistor, a second current node for receiving a second polarization voltage, and a gate;
   a feedback element coupled between the second current node of the second transistor and the gate of the first transistor; and
   circuitry coupled between the gates of the first and second transistors for forcing the voltage on the gate and the second current node of the first transistor to be substantially the same,
   wherein said circuitry is selected to compensate for an intrinsic capacitance between the gate and second current node of said first transistor.

2. The cascode amplifier of claim 1, wherein said circuitry comprises a capacitor.

3. The cascode amplifier of claim 2, wherein said capacitor has a value <10 picofarads.

4. The cascode amplifier of claim 1, wherein said circuitry comprises a buffer.

5. The cascode amplifier of claim 1, wherein said first and second transistors each comprise MOS transistors.

6. The cascode amplifier of claim 1, wherein said first and second transistors each comprise NMOS transistors.

7. The cascode amplifier of claim 4, wherein said buffer comprises a transistor.

8. The cascode amplifier of claim 4, wherein said buffer comprises a PMOS transistor.

9. The cascode amplifier of claim 4, wherein said buffer comprises a transistor having a first current node coupled to ground, a gate coupled to the gate of the first transistor, and a second current node coupled to the gate of the second transistor.

10. The cascode amplifier of claim 4 further comprising a current generator coupled to said buffer.

11. The cascode amplifier according to claim 1, wherein said cascode amplifier comprises an integrated device.

* * * * *